United States Patent [19]

Chen et al.

[11] Patent Number: 4,511,430
[45] Date of Patent: Apr. 16, 1985

[54] CONTROL OF ETCH RATE RATIO OF SIO$_2$/PHOTORESIST FOR QUARTZ PLANARIZATION ETCH BACK PROCESS

[75] Inventors: Lee Chen; Gangadhara S. Mathad, both of Poughkeepsie, N.Y.

[73] Assignee: International Business Machines Corporation, Armonk, N.Y.

[21] Appl. No.: 575,118

[22] Filed: Jan. 30, 1984

[51] Int. Cl.$^3$ .................. B44C 1/22; C03C 15/00; C03C 25/06; B29C 17/08
[52] U.S. Cl. .................. 156/643; 156/646; 156/657; 156/659.1; 156/668; 204/192 E; 252/79.1
[58] Field of Search .......... 156/643, 646, 657, 659.1, 156/668; 252/79.1; 204/192 E; 427/38, 39

[56] References Cited

U.S. PATENT DOCUMENTS 3,940,506 2/1976 Heinecke ............................. 427/38
4,324,611 4/1982 Vogel et al. ........................ 156/643
4,344,816 8/1982 Craighead et al. ................. 156/643

OTHER PUBLICATIONS

J. Electrochem. Soc.: Solid-State Science and Technology, vol. 128, No. 2, Feb. 1981, Planarization of Phosphorus-Doped Silicon Dioxide by A. C. Adams and C. D. Capio, pp. 423-429.

*Primary Examiner*—William A. Powell
*Attorney, Agent, or Firm*—Joseph E. Kieninger

[57] ABSTRACT

A method of controlling the etch rate ratio of SiO$_2$/photoresist (PR) in a quartz planarization etch back process involves etching with a gaseous mixture containing CF$_4$ and either CHF$_3$ or C$_x$F$_y$ with x>1 or O$_2$. The preferred SiO$_2$/PR ratio of 1.2±0.1 is obtained by either adding CHF$_3$ to decrease the etch rate of the PR or by adding O$_2$ to increase the etch rate of the PR.

6 Claims, 2 Drawing Figures

CONTROL OF ETCH RATE RATIO OF SIO$_2$/PHOTORESIST FOR QUARTZ PLANARIZATION ETCH BACK PROCESS

DESCRIPTION

1. Technical Field

This invention relates to a semiconductor etch back process and more particularly to a method of controlling the etch rate ratio of SiO$_2$/photoresist in a quartz planarization etch back process.

2. Background Art

In large scale integration (LSI) logic products metallurgy structures are positioned on several levels. In order to accurately interconnect these multilevel metallurgy structures, it is necessary to planarize each metallurgical structure level. As a result, obtaining a planar topography in multilevel metallization structures is a problem. One way to remove the topography in order to planarize a particular metallization level, is by the etch back process. The etch back process requires an etch rate ratio of SiO$_2$/photoresist to be 1.2±0.1. The present etching techniques prior to this invention have not been able to achieve the desired etch back ratio at high etch rates and with tight tolerances.

D. C. Vogel, et al, U.S. Pat. No. 4,324,611 describes an etching process for etching silicon dioxide and/or silicon nitride using a primary etching gas of CF$_4$ and a secondary gas of CHF$_3$. The chamber pressure is on the order or 1 to 3 torr when the primary gas is added. The addition of the secondary gas adds an additional 0.5 to 1.5 torr of pressure to the system. A third gas, such as helium, is added at a pressure of the order of 5 torr, when it is desired to prevent photoresist breakdown. This patent does not suggest a planarization process involving organic polymeric materials such as photoresist and silicon dioxide.

Other U.S. patents, R. A. Heinecke, U.S. Pat. No. 3,940,506 and H. G. Craighead et al, U.S. Pat. No. 4,344,816, suggest the use of combinations of CF$_4$ and CHF$_3$ gases but again not for the same purpose and not at the same pressures and composition in the gaseous reactive plasma.

SUMMARY OF THE INVENTION

It is a primary object of this invention to provide an improved quartz planarization etch back process.

It is another object of this invention to provide a method of controlling the etch rate ratio of SiO$_2$/photoresist (PR).

These and other objects are accomplished by a method that involves etching with a gaseous mixture containing CF$_4$ and either CHF$_3$ or C$_x$F$_y$ with x>1 or O$_2$. The preferred SiO$_2$/PR ratio of 1 is obtained by either adding CHF$_3$ to decrease the etch rate of the PR or by adding O$_2$ to increase the etch rate of the PR. In one preferred embodiment using a single wafer reactor to etch SiO$_2$ covered with a commercial photoresist (AZ) a gaseous mixture containing 97.5% CF$_4$, 2.5% CHF$_3$ and 0% oxygen provided an etch rate ratio of 1.096 whereas a gaseous mixture containing 97.0% CF$_4$, 3% CHF$_3$ and 0% oxygen yields an etch rate ratio of 1.196.

Other objects of this invention will be apparent from the following detailed description, reference being made to the following drawings in which a specific embodiment of the invention is shown.

DESCRIPTION OF THE PREFERRED EMBODIMENT

Figure 1:
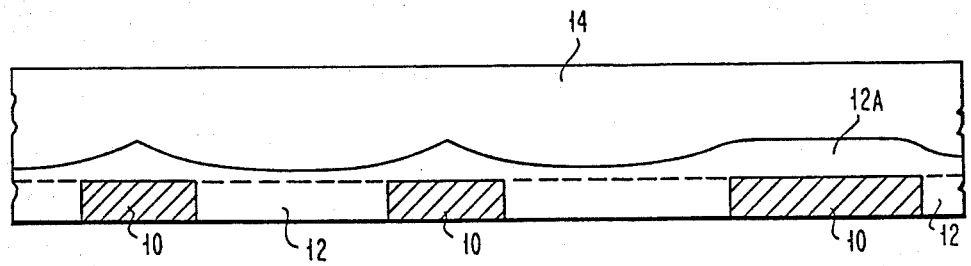
FIG. 1 is a cross-sectional view of the SiO$_2$/photoresist system to be etched in accordance with this invention.

The method of controlling the etch rate ratio of SiO$_2$/photoresist in a quartz planar etch back process includes the step of etching with a gaseous mixture containing CF$_4$ and either CHF$_3$ or C$_x$F$_y$ with x>1 or O$_2$. As shown in FIG. 1, topographical features 10, for example a metal such as copper, aluminum and the like, are covered with a rough substrate such as SiO$_2$ 12A. The purpose of this invention is to planarize the surface of the SiO$_2$ 12 that it is substantially planar or flat between the metal features 10 as shown in FIG. 2.

Figure 2:
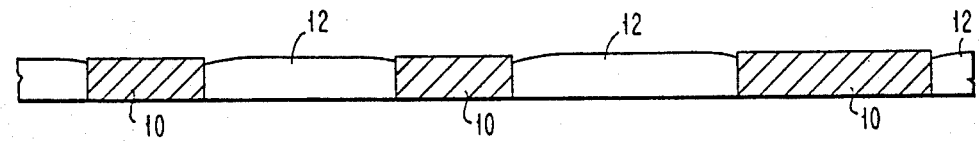
FIG. 2 is a cross-sectional view showing the planarized structure obtained in accordance with the etching process of this invention.

The structure shown in FIG. 2 is obtained with a process in accordance with this invention that involves etching a layer 14 of a photoresist material, i.e. an organic polymer material, which is positioned over the SiO$_2$ layer 12 as shown in FIG. 1. It is desired to etch uniformly through the resist layer 14 and the SiO$_2$ layer 12A with an etch rate ratio of 1.2±0.1 such that metal just sticks out of the SiO$_2$ surface. The etch rate ratio is defined as the etch rate of the oxide, SiO$_2$, over the etch rate of the photoresist. When a calculated etch rate ratio of 1.2±0.1 is obtained, then a planar structure such as shown in FIG. 2 is produced. Since the etch rate of different photoresists varies significantly, it is difficult to find one set of conditions that is suitable for more than one photoresist. In addition, the etch rates of the SiO$_2$ and photoresist vary significantly depending upon the apparatus and equipment used.

In accordance with this invention an etch rate ratio of 1.2±0.1 is obtained by etching the structure shown in FIG. 1 with a gaseous mixture at a pressure of not less than 500 microns of mercury containing CF$_4$ and either CHF$_3$ or or C$_x$F$_y$ with x>1 or oxygen. The composition of the gaseous mixture depends upon the etching characteristics of the photoresist material used in layer 14. The composition of the gaseous mixture contains an etching gas, a polymerizing gas and an oxidizing gas to achieve a balance between surface etching, gas phase polymerization and surface oxidation reactions. The CF$_4$ gas is the primary gas for etching SiO$_2$. The CHF$_3$ or C$_x$F$_y$ with x>1 gas is primarily added to decrease the etch rate of the photoresist. The CHF$_3$ or C$_x$F$_y$ with X>1 gas is a polymerizing gas for the control of gas phase polymerization. The C$_x$F$_y$ with x>1 gas is unsaturated. Examples of such a gas are C$_2$F$_4$ and C$_2$F$_6$. The O$_2$ gas is used primarily to increase the etch rate of the resist. The oxygen gas is for controlling surface oxidation of the polymer that is deposited by the second gas (CHF$_3$). The combination of these three gases provides a wide latitude in achieving etch rate ratios so that the planarization objectives can be easily met even with varying photoresist properties.

The following examples illustrate the effect of CHF$_3$ and O$_2$ on the etch rate ratio.

| EXAMPLE No. | % CF$_4$ | % CHF$_3$ | % O$_2$ | PR | Estimated Over All ERR | Planarity Satisfactory |
| --- | --- | --- | --- | --- | --- | --- |
| 1 | 100.0 | 0 | 0 | AZ1350J | 0.860 | No |
| 2 | 99.0 | 1 | 0 | AZ1350J | 0.989 | No |
| 3 | 98.5 | 1.5 | 0 | AZ1350J | 1.017 | No |
| 4 | 97.5 | 2.5 | 0 | AZ1350J | 1.096 | Yes |
| 5 | 97.0 | 3 | 0 | AZ1350J | 1.196 | Yes |
| 6 | 95.0 | 5 | 0 | AZ1350J | 1.570 | No |
| 7 | 100.0 | 0 | 0 | HC | 0.95 | No |
| 8 | 80 | 20 | 0 | HC | 2.5 | No |
| 9 | 70 | 30 | 0 | HC | 1.7 | No |
| 10 | 80 | 20 | 0 | HC | 1.3 | Yes |
| 11 | 90 | 10 | 0 | HC | 1.2 | Yes |
| 12 | 90 | 0 | 10 | HC | 0.8 | No |

Although preferred embodiments have been described, it is understood that numerous variations may be made in accordance with the principles of this invention.

We claim:

1. A method for uniformly etching a surface which includes both silicon dioxide and an organic polymer material comprising the steps of
   contacting said surface with a reactive etching plasma which contains CF$_4$ and a gas taken from the group consisting of CHF$_3$ and C$_x$F$_y$ with x>1 to cause the structure formed by said etching step to be substantially planar and have an etch rate ratio of 1.2±0.1.

2. A method as described in claim 1 whereby said etching plasma contains CHF$_3$.

3. A method as described in claim 2 whereby the gaseous mixture contains 0.5 to 5.0% CHF$_3$.

4. A method as described in claim 1 including the step of evacuating said structure to a pressure of not less than 500 microns of mercury.

5. A method as described in claim 1 whereby said reactive etching plasma contains oxygen.

6. A method as described in claim 5 whereby the reactive etching plasma contains 0.5 to 10 volume % O$_2$.

* * * * *